United States Patent [19]
Motomura

[11] Patent Number: 5,586,079
[45] Date of Patent: Dec. 17, 1996

[54] ADDRESS GENERATING AND DECODING DEVICE AND METHOD WITH INCREASED DECODING SPEED

[75] Inventor: Masato Motomura, Tokyo, Japan

[73] Assignee: NEC Corporation, Tokyo, Japan

[21] Appl. No.: 401,927

[22] Filed: Mar. 9, 1995

[30] Foreign Application Priority Data

Mar. 9, 1994 [JP] Japan .................................. 6-038131

[51] Int. Cl.$^6$ ...................................... G11C 8/00
[52] U.S. Cl. ...................... 365/230.06; 326/106; 326/108
[58] Field of Search .................... 365/230.06, 230.08, 365/189.11; 326/105, 106, 108

[56] References Cited

U.S. PATENT DOCUMENTS

| | | | |
|---|---|---|---|
| 5,331,219 | 7/1994 | Nakamura | 365/189.11 |
| 5,359,553 | 10/1994 | Shiomi | 365/189.11 |

Primary Examiner—David C. Nelms
Assistant Examiner—Son Mai
Attorney, Agent, or Firm—Foley & Lardner

[57] ABSTRACT

An address generator generates a binary coded address signal consisting of a combination of bit-representative low swing complementary signals. The coded address signal is decoded by an address decoder in a concurrently amplifying manner to obtain a decoded address signal consisting of a combination of symbol-representative full swing signal pairs of logical signals. The decoder comprises a binary tree of sense amplifiers each serving for outputting a logical product of an input enable signal and a corresponding low swing complementary signal, so that a single logical signal has a high level at the output end of the decoder. The high level logical signal is employed to drive a word line for an access to an arbitrary location defined in a given memory or to a desired piece of data stored therein, at an address represented by the decoded address signal.

11 Claims, 4 Drawing Sheets

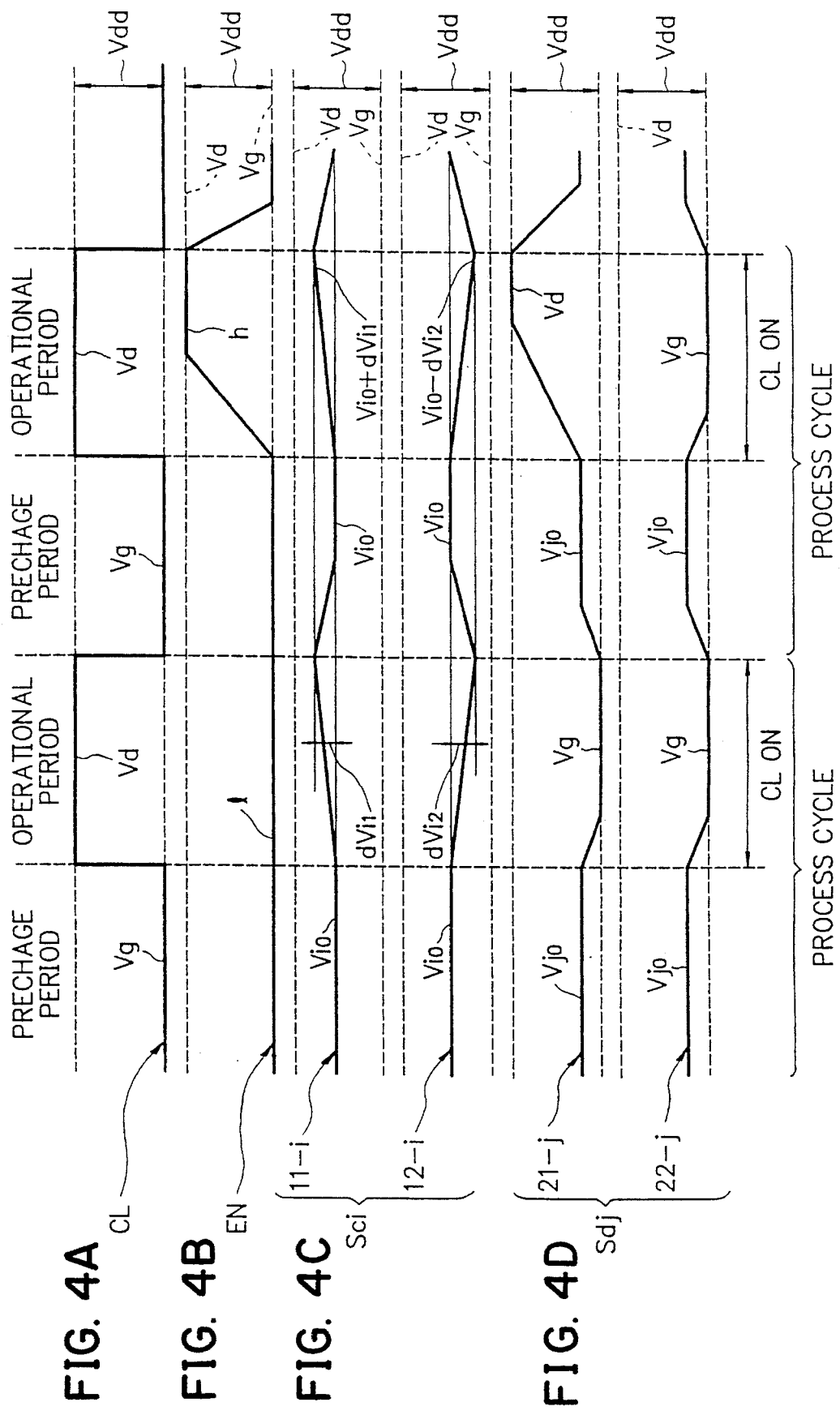

ADDRESS GENERATING AND DECODING DEVICE AND METHOD WITH INCREASED DECODING SPEED

BACKGROUND OF THE INVENTION

The present invention relates to an address generating and decoding device and an address generating and decoding method each implemented to have an increased decoding speed.

DESCRIPTION OF THE RELATED ART

For an intended access to an addressed location in a given memory, such as for reading therefrom a desired piece of stored data or storing therein a certain piece of updating data, it is necessary to generate by computation an address signal representing an own address of the location, in an applicable form to the memory, in consideration of the state of art where the signal generation by computation is subjected to an incomprehensive coding to the memory.

To implement the desideratum, usually employed is an address generating and decoding device comprising an address generator for generating a binary coded address signal that represents a binary coded number consisting of a number of bits (binary digits), and an address decoder for decoding the coded address signal to obtain a decoded address signal consisting of a combination of comprehensive logical high-low level symbols to a given memory.

The address generator generally is implemented as a variety of arithmetic operation circuitry. Some typical examples such as in the field of a microprocessor include addition circuitry for adding a sequence of associated displacements to a heading or starting address to thereby compute an own address of a target location in an intended access. There may be employed a number of counters or multipliers for the address computation, such as in the field of an applied semiconductor integration. The computed address is output as a binary coded number in the form of a combination of a number of bit-representative signals.

The address decoder is adapted to decode the coded address signal to obtain a decoded address signal representative of the computed address, so that the decoded address signal which consists of an increased number of logical symbols is directly applicable to the memory, to achieve the intended access in a various manner such as by using a high level symbol to drive a word line of the memory.

Recent years have observed an increasing tendency in the art to use computation circuitry including a number of bit-correspondent operators each composed of a low swing circuit, to answer potential demands for an increased process speed as well as a reduced power dissipation.

Typically employed in the low swing circuit is a complementary signal consisting of a combination of a positive signal and a negative signal, which are equalized to an intermediate voltage level in their normal states and, when activated, either or each caused to deviate therefrom with a minute amplitude variation to have a complementary relationship established to define a binary value 1 with the positive signal lying at a higher level than the negative signal, accompanying a potential difference developed therebetween, or another complementary relationship established to define a binary value 0 with the positive signal at a lower level than the negative signal.

This low swing concept eliminates the need of a full swing to be achieved between a power supply voltage and a ground potential, thus permitting both an effective increase in process speed for address computation and an effective reduction of power dissipation. Some typical examples of practical implementation include an n-MOS pass transistor circuit, a current mode MOS circuit or the like.

Conventionally, however, the address decoder has been made as a random logic circuit consisting of a combination such as of NAND gates or NOR gates. As a result, despite the provision of an address generator having in each bit-correspondent operator thereof a low swing circuit employed with an intention to achieve an increased process speed, it has been necessary to intentionally amplify each low swing signal once output from the generator in a complementary form, to obtain a bit-representative full swing signal to be input to the address decoder. Such amplification inherently has dissipated power in proportion to the number of actuated amplification circuits. Moreover, the signal amplification for each output has been accompanied with a temporal overhead, thus constituting an obstruction to make an efficient use of the potential advantage that the low swing circuit inherently has to permit a high speed processing to be achieved.

In this connection a probable solution may suggest a simply extended use of the conventional low swing concept to constitute an address decoder of a low swing type. However, the intended access into an available memory inherently needs the application of a decoded address signal consisting of a combination of high-low levels in a requisite full swing, when activated, such as for driving a word line for example. Accordingly, still in that case, the address decoder might have each logical signal therefrom additionally amplified, thus needing an amplification process to be inserted after the decoding.

Incidentally, the number of logical symbols of a decoded signal to be output from an address decoder usually amounts to a power of a corresponding exponent of 2 to the number of bits of an input coded signal to the decoder.

Therefore, such a probable solution may need an enormous number of amplification circuits, resulting in unavoidable dissipation of a significant amount of electric power, which may constitute an additional problem to the conventional decoding that has been accompanied with a temporal overhead due to an inserted amplification process.

SUMMARY OF THE INVENTION

The present invention has been achieved with such points in mind.

It therefore is an object of the present invention to provide an address generating and decoding device and an address generating and decoding method, each permitting an increased decoding speed.

To achieve the object, a genus of the present invention provides an address generating and decoding device for generating a decoded address signal employable for an access into a given memory, comprising an address generator for generating a coded address signal consisting of a combination of low swing complementary signals, and an address decoder for decoding the combination of low swing complementary signals in a concurrently amplifying manner to obtain the decoded address signal consisting of a combination of full swing signals.

Further, to achieve the object, another genus of the present invention provides an address generating and decoding method for generating a decoded address signal employable for an access into a given memory, comprising the steps of generating a coded address signal consisting of a combination of low swing complementary signals, and decoding the combination of low swing complementary signals in a concurrently amplifying manner to obtain the decoded address signal consisting of a combination of full swing signals.

According to either genus of the invention, an address generator generates a coded address signal consisting of a combination of low swing complementary signals. The combination of low swing complementary signals is decoded in a concurrently amplifying manner by an address decoder to obtain a decoded address signal consisting of a combination of full swing signals. The full swing signals may be directly employed for an access to an arbitrary location defined in a given memory or to a desired piece of data stored therein, at an address represented by the decoded address signal.

The concurrent amplification with the decoding eliminates the need of an additional amplification process inserted before or after the decoding, and hence is free from a conventional temporal overhead.

According to the invention, therefor, an address generating and decoding device and an address generating and decoding method are each respectively permitted to achieve an effective address generation with an increased decoding speed.

BRIEF DESCRIPTION OF THE DRAWINGS

The objects, features and advantages of the present invention will become more apparent from consideration of the following detailed description, taken in conjunction with the accompanying drawings, in which:

FIG. 4 is a timing chart of a number of associated signals with the sense amplifier of FIG. 3.

DESCRIPTION OF THE PREFERRED EMBODIMENTS

There will be described below preferred embodiments of the present invention, with reference to FIGS. 1 to 4.

Figure 1:
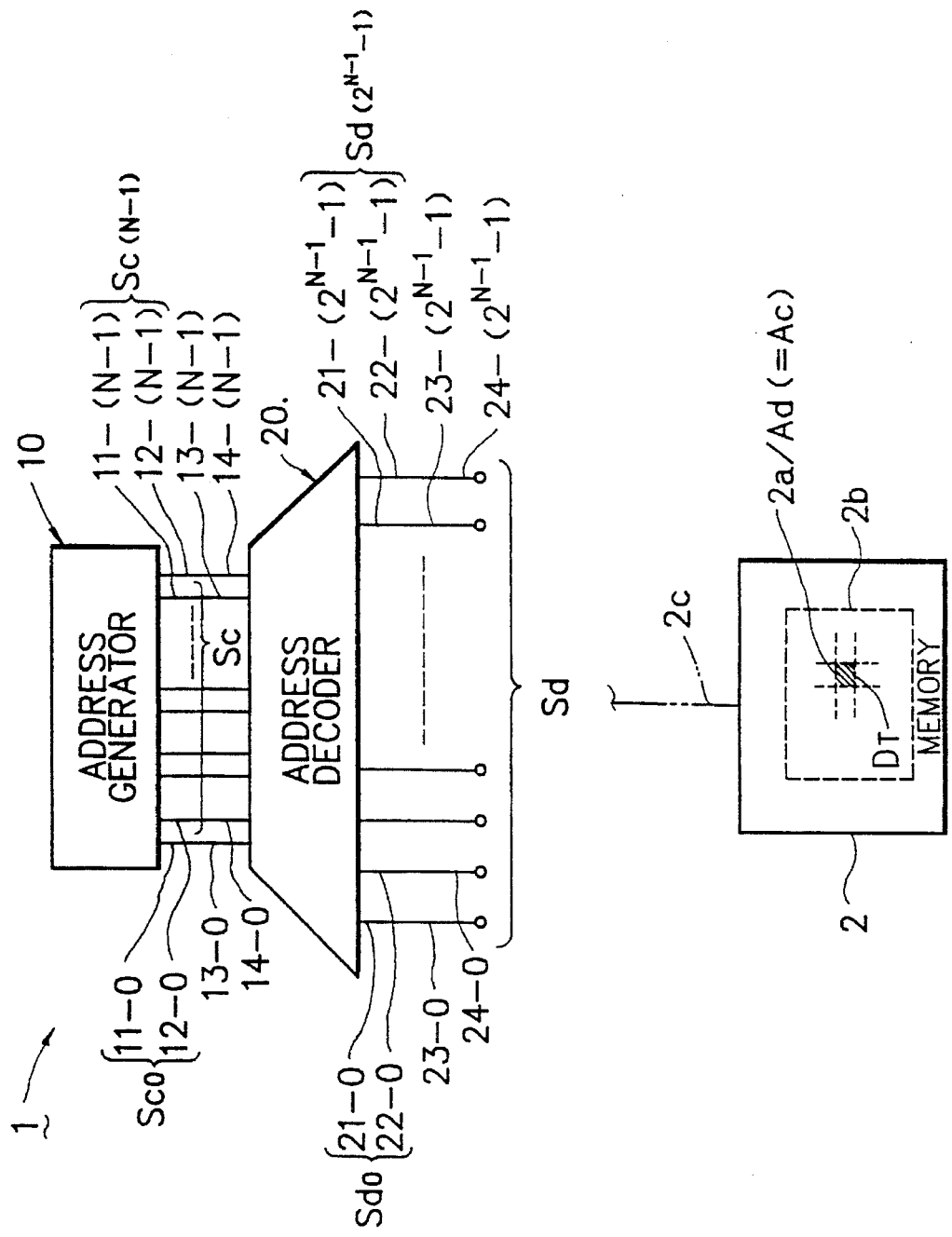
FIG. 1 is a schematic block diagram of a combination of an address generating and decoding device according to an embodiment of the invention and a memory connected to the device.

FIG. 1 shows a combination of an address generating and decoding device 1 according to an embodiment of the invention and a memory 2 connected to the device.

The address generating and decoding device 1 is implemented to generate a sequence of decoded address signals employable for a series of intended accesses into the memory 2.

More specifically, for each cycle of the accessing, the device 1 is adapted to generate a decoded address signal Sd directly employable for an access to an arbitrary location 2a in a storage region 2b of the memory 2 or to a desired piece of data Dt stored therein, at an address Ad represented by the decoded address signal Sd, as it is decoded into a comprehensive machine language to the memory 2.

The address generating and decoding device 1 comprises an address generator 10 for generating a coded address signal Sc consisting of a combination of below-described low swing complementary signals, and an address decoder 20 for decoding the combination of low swing complementary signals, in a concurrently amplifying manner and hence without the need of an amplification process inserted before or after the decoding process, to obtain the decoded address signal Sd consisting of a combination of later-described full swing pseudo-complementary signals to be output to the memory 2 through a connection member 2c consisting of a bundle of address lines.

The coded address signal Sc as well as the decoded address signal Sd represents the address Ad. In the coded address signal Sc, the address Ad is defined as a binary coded address Ac consisting of ordered N bits from 0-th to (N–1)-th, where N is a positive decimal integer, i.e. N>0. The signal Sc itself comprises N low swing complementary signals $Sc_i$ (i=0, 1, 2, ..., N–2, N–1) each one-to-one correspondent to any of the N bits so that an i-th low swing complementary signal $Sc_i$ represents a binary value 1 or 0 of an i-th one of the N bits.

Each low swing complementary signal $Sc_i$ consists of a positive signal 11-$i$ and a negative signal 12-$i$. As shown in FIG. 4, the positive and negative signals 11-$i$, 12-$i$ are substantially equalized to an intermediate voltage level $V_{i0}$ between a power supply voltage Vd and a ground voltage Vg, in their normal states that appear in a precharge period of each access cycle and cooperatively represent an indefinite value of the complementary signal $Sc_i$. When activated in an operational period of the access cycle in synchronism with a supplied system clock signal CL to the device 1, the positive and negative signals 11-$i$, 12-$i$ are each (or either in a modification) caused to deviate from the intermediate level $V_{i0}$ with a minute amplitude variation $dV_{i1}$ (for 11-$i$) or $dV_{i2}$ (for 12-$i$), so that the signal $Sc_i$ has either a predetermined complementary relationship established to represent the binary value 1 (as shown in the figure) by cooperation between the positive signal 11-$i$ rising to a higher level $V_{i0}+dV_{i1}$ and the negative signal 12-$i$ falling to a lower level $V_{i0}-dV_{i2}$, with a detective potential difference dV $\{=dV_{i1}+dV_{i2}\}$ developed therebetween, or another predetermined complementary relationship established to represent the binary value 0 (not shown in the figure) by cooperation between the negative signal 12-$i$ rising to a higher level $V_{i0}+dV_{i1}$ and the positive signal 11-$i$ falling to a lower level $V_{i0}-dV_{i2}$.

The clock signal CL has the ground voltage Vg when it is in an off state, and the power supply voltage Vd when it is in an on state. Designated as Vdd is a voltage difference between the power supply voltage Vd and the ground voltage Vg. The voltage difference Vdd defines a full swing amplitude, and a minute voltage in comparison therewith defines a low swing amplitude.

As shown in FIG. 1, the positive signal 11-$i$ and the negative signal 12-$i$ of each low swing complementary signal $Sc_i$ of the coded address signal Sc are input from the address generator 10 to the address decoder 20, through parallel input lines 13-$i$ and 14-$i$, respectively.

At the address decoder 20, the coded address signal Sc is decoded, in a logically descending manner along a binary tree and in a concurrently amplifying manner from a low swing to a full swing at each stage of the binary tree, to obtain the decoded address signal Sd that represents the address Ad in terms of an interpreted word into the comprehensive machine language to the memory 2. The interpreted word is given in the form of ordered $2^N$ binary symbols from 0-th to $(2^N-1)$-th. The decoded signal Sd itself comprises $2^{N-1}$ full swing pseudo-complementary signals $Sd_j$ (j=0, 1, 2, ..., $2^{N-1}-2$, $2^{N-1}-1$) each consisting of independently acting positive and negative logical level signals $21$-$j$, $22$-$j$, which are one-to-one correspondent to the $2^N$ symbols, so that the positive signal $21$-$j$ represents a significant definite value 1 or 0 or an indefinite value of a 2j-th symbol, and also the negative signal $22$-$j$, a significant definite value 1 or 0 or an indefinite value of a (2j+1)-th symbol, as detailed below.

As shown in FIG. 4, the positive and negative signals $21$-$j$, $22$-$j$ of the full swing pseudo-complementary signal $Sd_j$ are substantially equalized to an intermediate voltage level $V_{j0}$ in their normal states that appear in the precharge period and represent the indefinite values of corresponding symbols. When activated in synchronism with the clock signal CL, they have varied voltages in dependence on a pair of variants either to be the last (N–1)-th bit representative low swing complementary signal $Sc_{(N-1)}$ in the coded address signal Sc and the other to be a later-described enable signal EN (a symbol-representative logical level signal) that is responsive to an associated symbol in a decoded result with respect to the preceding low swing complementary signals $Sc_0$ to $Sc_{(N-2)}$ in the same coded address signal Sc.

The enable signal EN is allowed to have a low level l equivalent to the ground level Vg or a high level h equivalent to the power supply level Vd. If the signal EN is set to the low level l when the full swing pseudo-complementary signal $Sd_j$ is activated, then the positive and negative signals $21$-$j$, $22$-$j$ thereof vary from the normal level $V_{j0}$ to the ground level Vg. On the other hand, if the enable signal EN is set to the high level h, then the positive and negative signals $21$-$j$, $22$-$j$ of the full swing pseudo-complementary signal $Sd_j$ vary from the normal level $V_{j0}$ to the ground level Vg or to the power supply level Vd in accordance with the sense of variations of the positive and negative signals $11$-(N–1), $12$-(N–1) of the low swing complementary signal $Sc_{(N-1)}$, respectively, as will be described later.

As shown in FIG. 1, the positive signal $21$-$j$ and the negative signal $22$-$j$ of each full swing pseudo-complementary signal $Sd_j$ in the decoded address signal Sd are output from the address decoder 20 to the memory 2, through parallel output lines $23$-$j$ and $24$-$j$, respectively. In the memory 2, the full swing pseudo-complementary signal $Sd_j$ is employed to drive a 2j-th or (2j+1)-th one of $2^N$ address or word lines ordered from 0-th to ($2^N-1$)-th (not shown).

Figure 2:
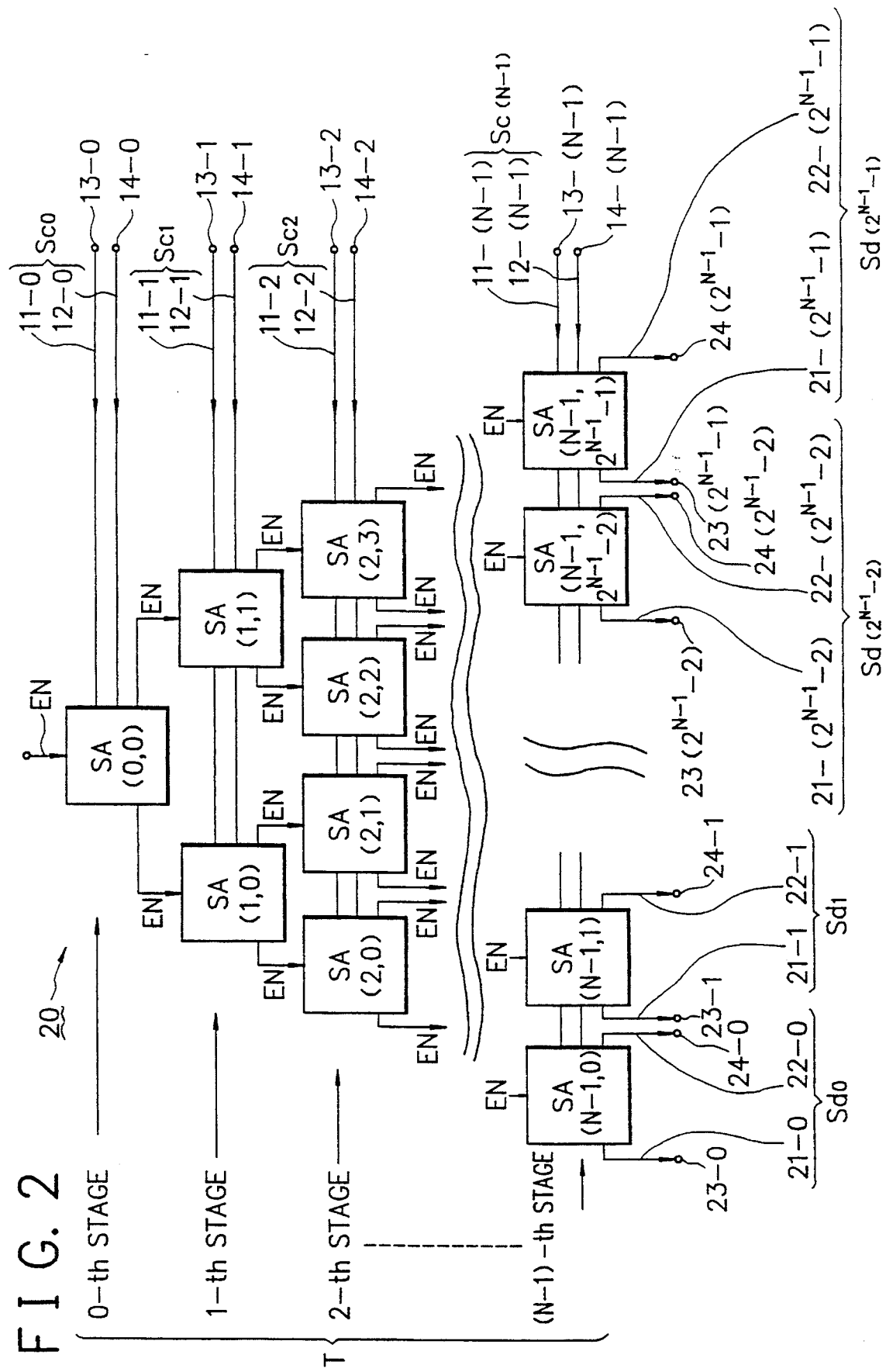
FIG. 2 is a block diagram of an address decoder in the address generating and decoding device of FIG. 1.

FIG. 2 shows internal circuitry of the address decoder 20. The decoder 20 comprises an N-staged binary tree T of sense amplifiers SA, having N stages thereof vertically numbered from the top 0-th to the bottom (N–1)-th in the figure. An arbitrary i-th stage consists of laterally ordered $2^i$ sense amplifiers SA(p,q) from the leftmost 0-th to the rightmost ($2^i$–1)-th in the figure, where p is a corresponding number to the stage number i (i.e. p=i, $0 \leq i \leq N-1$) and, letting a k-th amplifier in the i-th stage be identified by SA(i, q), q is a corresponding number to the number k of the identified amplifier (i.e., q=k, $0 \leq k \leq 2^i-1$). Hence, at any stage, the minimum (leftmost) value $k_m$ of k is 0, and the maximum (rightmost) value $k_M$ of k equals to M–1, where M is the number of the sense amplifiers in the same stage. If i=0 (the top stage), then M=$2^0$=1 and $k_m$=$k_M$=0. If i=N–1 (the bottom stage), then M=$2^{N-1}$, $k_m$=0 and $k_M$=$2^{N-1}-1$.

The sense amplifiers SA(i,k) in the i-th stage of the binary tree T each respectively have: an enable signal input line for inputting thereto the enable signal EN or a substituting signal therefor: a low swing complementary signal input connection which consists of a first input line connected to the input line $13$-$i$ for inputting the positive signal $11$-$i$ of the low swing complementary signal $Sc_i$ and a second input line connected to the input line $14$-$i$ for inputting the negative signal $12$-$i$ of the signal $Sc_i$; and a full swing pseudo-complementary signal output connection which, at each stage but the bottom one, consists of a left (in the figure) output line connected to the enable signal input line of a 2k-th sense amplifier SA(i+1, 2k) in the next (i+1)-th stage and a right (in the figure) output line connected to that of a next-ordered sense amplifier SA(i+1, 2k+1) to the amplifier SA(i+1, 2k) in the (i+1)-th stage. At the bottom (N–1)-th stage, the output connection of each sense amplifier SA(N–1, j) consists of a left output line connected to the output line $23$-$j$ for outputting the positive signal $21$-$j$ of the full swing psedo-complementary signal $Sd_j$ and a right output line connected to the output line $24$-$j$ for outputting the negative signal $22$-$j$ of the psedo-complementary signal $Sd_j$.

Hereinbelow, in each stage of the binary tree T, the first and the second input line of each sense amplifier SA(i,k) will also be referred to by $13$-$i$ and $14$-$i$, respectively, including associated terminals. In any stage other than the bottom one, the left and the right output line of each sense amplifier SA(i,k) will be referred to by $23$-$(i,k)$ and $24$-$(i,k)$, respectively, including associated terminals. At the bottom stage, the left and the right output line of each sense amplifier SA(N–1, j) will be referred to by $28$-$j$ and $24$-$j$, respectively, including associated terminals. In other words, in all stages including the bottom one, the left and the right output line of each sense amplifier SA(i,k) will be referred to by $23$-$(i,k)$ and $24$-$(i,k)$, respectively, providing that $23$-(N–1, j) and $24$-(N–1, j) mean $23$-$j$ and $24$-j, respectively. Moreover, the input connection consisting of the first $13$-$i$ and the second input line $14$-$i$ and the output connection consisting of the left $23$-$(i,k)$ and the right output line $24$-$(i,k)$ of any sense amplifier SA(i,k) will at times be referred to by $13/14$-$i$ and $23/24$-$(i, k)$, respectively.

Figure 3:
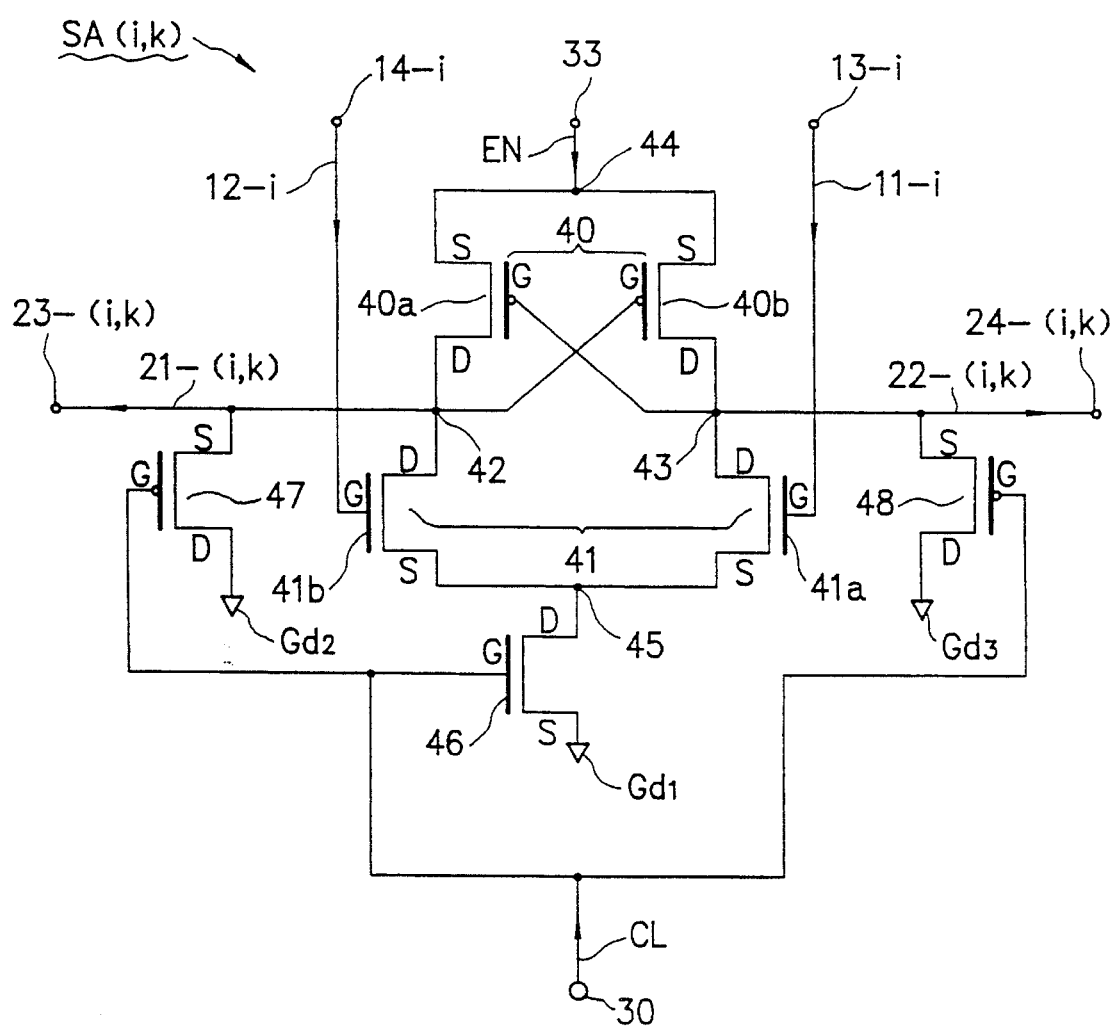
FIG. 3 is a circuit diagram of a sense amplifier in the address decoder of FIG. 2.

FIG. 3 shows a circuit diagram of a k-th sense amplifier SA(i,k) in an i-th stage of the binary tree T.

The amplifier SA(i,k) has a clock signal input terminal 30 for inputting thereto the clock signal CL, and an enable signal input terminal 33 for inputting thereto the enable signal EN that is a received signal through the enable signal input line of that amplifier.

The amplifier SA(i,k) further has the input connection $13/14$-$i$ that consists of the first input line $13$-$i$ including a positive signal input terminal and the second input line $14$-$i$ including a negative signal input terminal, for inputting the positive signal $11$-$i$ and the negative signal $12$-$i$ respectively of the low swing complementary signal $Sc_i$ which represents an i-th bit of the coded address signal Sc, and the output connection $23/24$-$(i,k)$ that consists of the left output line $23$-$(i,k)$ including a positive signal output terminal and the right output line $24$-$(i,k)$ including a negative signal output terminal, for outputting a positive signal $21$-$(i,k)$ and a negative signal $22$-$(i,k)$ respectively of a full swing pseudo-complementary signal $Sd(i,k)$ which represents 2i-th and (2i+1)-th symbol values of a decoded address signal Sd(k) at the k-th stage of the binary tree T, when the flow of the decoding process descends along the tree T. The positive signal $21$-$(i,k)$ of the full swing pseudo-complementary signal Sd(i,k) is employed as the enable signal EN of a 2k-th sense amplifier SA(i+1, 2k) in the next (i+1)-th stage and hence is output to the enable signal input terminal 33 of this amplifier SA(i+1, 2k), and the negative signal $22$-$(i,k)$ of the full swing pseudo-complementary signal Sd(i,k) is employed as the enable signal EN of a (2k+1)-th sense amplifier SA(i+1, 2k+1) in the next (i+1)-th stage and hence is output to the enable signal input terminal 33 of this amplifier SA(i+1, 2k+1).

For example, as shown in FIG. 2, at the top or initial 0-th stage, a single sense amplifier SA(0,0) has the input connection 13/14-0 thereof consisting of the input lines 13-0 and 14-0 for inputting thereto the positive and negative signals 11-0 and 12-0 respectively of the low swing complementary signal $Sc_0$ representing the 0-th bit of the coded address signal Sc, and (as will be seen from FIG. 3) an output connection 23/24-(0,0) thereof consisting of output lines 23-(0,0) and 24-(0,0) for outputting therefrom the positive and negative signals 21-(0,0) and 22-(0,0) respectively of a full swing pseudo-complementary signal Sd(0,0). The positive signal 21-(0,0) is output as the enable signal EN to the enable signal input terminal 33 of a 0-th amplifier SA(1,0) in the 1-th stage, and the negative signal 22-(0,0) is output as the enable signal EN to the input terminal 33 of a 1-th amplifier SA(1,0) in the 1-th stage. The enable signal EN to be input to the sense amplifier SA(0,0) in the initial 0-th stage is externally provided as a symbol representative signal kept at a high level h equivalent to the voltage difference Vdd between the power supply level Vd and the ground level Vg, while the address decoder 20 is driven with necessary power supplied. The power supply voltage Vd may thus be directly employed as the enable signal EN to be input to the initial 0-th stage.

At the bottom or last (N−1)-th stage also, an arbitrary sense amplifier SA(N−1, j) has an input connection 13/14-(N−1) thereof consisting of the input lines 13-(N−1) and 14-(N−1) for inputting thereto the positive and negative signals 11-(N−1) and 12-(N−1) respectively of the low swing complementary signal $Sc_{(N-1)}$ representing the (N−1)-th bit of the coded address signal Sc, and an output connection 23/24-(N−1, j) thereof consisting of output lines 23-(N−1, j) {=23-j} and 24-(N−1, j) {=24-j} for outputting therefrom the positive and negative signals 21-(N−1, j) and 22-(N−1, j) respectively of a full swing pseudo-complementary signal Sd(N−1, j) that is the pseudo-complementary signal $Sd_j$ representing a 2j-th and (2j+1)-th symbol values of the decoded address signal Sd(N−1) {=Sd} at the bottom (N−1)-th stage. The signals 21-(N−1, j) and 22-(N−1, j) are output as the positive and negative signals 21-j and 22-j of the pseudo-complementary signal $Sd_j$ to the memory 2.

As in FIG. 3, each sense amplifier SA(i,k) comprises a cross-coupled pair 40 of a left 40a and a right p-MOS (p-type metal oxide semiconductor) transistor 40b, a differential pair 41 of a right 41a and a left n-MOS (n-type metal oxide semiconductor) transistor 41b, a current source n-MOS transistor 46, a left equalizing p-MOS transistor 47 and a right equalizing p-MOS transistor 48. Each transistor is constituted as a field effect type having a source electrode S, a drain electrode D and a gate electrode G.

The left and right p-MOS transistors 40a, 40b of the cross coupled pair 40 have the source electrodes S thereof connected to an upper common node 44 that is connected to the enable signal input terminal 33, the drain electrodes D thereof connected to a left node 42 and a right node 43, respectively, and the gate electrodes G thereof cross-connected to the right node 43 and the left node 42, respectively.

To this point, in a conventional sense amplifier, an enable signal input terminal is connected to a power supply line, to receive therefrom a power supply voltage.

The right and left n-MOS transistors 41a, 41b of the differential pair 41 have the source electrodes S thereof connected to a lower common node 45 that is connected to the drain electrode D of the current source n-MOS transistor 46, the drain electrodes D thereof connected to the right node 43 and the left node 42, respectively, and the gate electrodes G thereof connected to the positive and negative signal input terminals 13-i, 14-i of the low swing complementary signal $Sc_i$ respectively.

The left and right equalizing p-MOS transistors 47, 48 have the source electrodes S thereof connected to the positive and negative signal output lines 23-(i,k), 24-(i,k) of the pseudo-complementary signal Sd(i,k), respectively. Designated at $Gd_1$ to $Gd_3$ are grounded terminals, respectively. The clock signal input terminal 30 is connected to the respective gate electrodes G of the current source transistor 46 and the equalzing transistors 47, 48.

In the precharge period of each access cycle, the clock signal CL is in the off state and hence the left and right equalizing transistors 47, 48 are turned on, so that the left and right nodes 42, 43 have an equalized voltage to a threshold voltage of the cross-coupled p-MOS transistors 40a, 40b. The positive signal 21-(i,k) and the negative signal 22-(i,k) to be output from the sense amplifier SA(i,k) to neighboring sense amplifiers SA(i+1, 2k) and SA(i+1, 2k+1) in the subsequent (i+1)-th stage are put in their normal states representing the indefinite symbol values, and also the enable signal EN to be input from a sense amplifier SA(i−1, m) in the previous (i−1)-th stage, where m=k/2 if k is an even number, or m=(k−1)/2 if k is an odd number.

In the operational period of each access cycle, the clock signal CL is in the on state and hence the current source transistor 46 is turned on.

In this period, if the enable signal EN input to the sense amplifier SA(i,k) has the low level l, the positive and negative signals 21-(i,k) and 22-(i,k) constituting the full swing pseudo-complementary signal Sd(i,k) both have a low level l equivalent to the ground level Vg, and are output as the enable signals EN of the low level l from the output terminals 23-(i,k) and 24-(i,k) to the sense amplifiers SA(i+1, 2k) and SA(i+1, 2k+1) in the subsequent (i+1)-th stage, respectively.

In the case the enable signal EN input to the sense amplifier SA(i,k) in the operational period has the high level h, the low swing complementary signal $Sc_i$ consisting of the positive and negative signals 11-i, 12-i input from the terminals 13/14-i is amplified to obtain the full swing pseudo-complementary signal Sd(i,k) consisting of the positive and negative signals 21-(i,k), 22-(i,k) to be output from the terminals 23/24-(i,k), so that the positive signal 21-(i,k) has a correspondent logical level to the sense of variation of the positive signal 11-i, and the negative signal 22-(i,k) has a correspondent logical level to the sense of variation of the negative signal 12-i.

If the complementary signal $Sc_i$ is set to a binary value 1, then its positive signal 11-i is varied in a positive sense thereof (i.e. in the level-increasing direction) and its negative signal 12-i also is varied in a positive sense thereof (i.e. in the level-decreasing direction) and hence the positive signal 21-(i,k) of the pseudo-complementary signal Sd (i,k) has its logical level varied in a positive sense thereof (i.e. increased to the high level h) and the negative signal 22-(i,k) thereof also has its logical level varied in a positive sense thereof (i.e. decreased to the low level l).

To the contrary, if the complementary signal $Sc_i$ is set to a binary value 0, then the positive signal 11-i is varied in a negative sense thereof (i.e. in the level-decreasing direction) and the negative signal 12-i also is varied in a negative sense thereof (i.e. in the level-increasing direction) and hence the positive signal 21-(i,k) of the pseudo-complementary signal Sd(i,k) has its logical level varied in a negative sense thereof (i.e. decreased to the low level l) and the negative signal 22-$(i,k)$ also has its logical level varied in a negative sense thereof (i.e. increased to the high level h).

In other words, letting Xp, Xn be positive logical values in terms of the level increasing direction of the positive and negative signals 11-$i$, 12-$i$, respectively, Y be a positive logical value in terms of the logical level of the enable signal EN, and Zp, Zn be positive logical values in terms of the logical level of the positive and negative signals 21-$(i,k)$, 22-$(i,k)$, the sense amplifier SA(i,k) functions as a component-wise Boolean operator F, such that:

$$\begin{aligned}(Zp, Zn) &= F(Xp, Xn; Y) \\ &= (Xp, Xn) \cdot Y \quad \{\cdot = : \text{AND}\} \\ &= (Xp \cdot Y, Xn \cdot Y)\end{aligned}$$

From the definition, Xp and Xn are negative logic values to each other (i.e. Xn=Xp'), and Xp represents a corresponding positive logic value 1 or 0 to the binary value 1 or 0 of an i-th low swing complementary signal $Sc_i$ in the coded address signal Sc. Likewise, Zp and Zn are negative logic values to each other (i.e. Zn=Zp'), and Zp represents a corresponding positive logic value 1 or 0 to a symbol value 1 or 0 of a k-th full swing pseudo-complementary signal in a decoded result at an i-th stage of the binary tree T.

In the 0-th stage of the binary tree T, Y=1, so that (Zp, Zn)=(Xp, Xn)=(Xp, Xp'). If Xp=1, then Zp=1 and Zn=0. If Xp=0, then Zp=0 and Zn=1. Therefore, either enable signal EN output from the 0-th stage has the high level h and the other has the low level l.

In the 1-th stage, if Y for SA(1,1) equals 1, then Y for SA(1,2) equals 0, so that (Zp, Zn) at SA(1,1) equals (Xp, Xp') and (Zp, Zn) at SA(1,2) equals (0,0). If Y for SA(1,1) equals 0, then Y for SA(1,2) equals 1, so that (Zp, Zn) at SA(1,1) equals (0,0) and (Zp, Zn) at SA(1,2) equals (Xp, Xp'). As a result, among four enable signals EN output from the 1-th stage, only one enable signal EN has the high level h and the others have the low level l.

As will be seen from the symmetry of the binary tree T, in any stage thereof, a single sense amplifier has an enable signal EN input thereto with the high level h and hence that amplifier only is permitted to output a logical high level voltage Vd to be employed as an enable signal EN to the next stage or as a drive signal of a single address line. Accordingly, power dissipation of the address generating and decoding device 1 is effectively reduced.

Moreover, as will be understood from the foregoing description, the decoding at the address decoder 20 advantageously includes a concurrent amplification of paired signals from a low swing to a full swing, thus eliminating the conventional needs of an additionally inserted amplification before or after the decoding. The decoding is thus free from a conventional temporal overhead, permitting an increased decoding speed to be achieved.

It will be understood that each sense amplifier SA(i,k) may be of any type that has a function of inputting an enable signal and a low swing complementary signal and of outputting a signal representative of a logical product of the input signals.

It also will be understood that the p-MOS transistors 40a, 40b and the n-MOS transistors 41a, 41b may be substituted by a pair of n-MOS transistors and a pair of p-MOS transistors, respectively.

Further, the equalizing p-MOS transistors 47, 48 may be substituted by a pair of n-MOS transistors connected to a power supply line or to a grounded line.

Still more, a flip-flop type sense amplifier may preferably be employed in combination with an enable signal input thereto in place of a power supply voltage.

The present invention may preferably be applied to an LSI (large scale integration) chip having an address generating and decoding device and a memory both built therein. It however will be understood that the invention may be applied in a voluntary form such as for a system including an assembled, line-connected or radio-communicatable memory.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. An address generating and decoding device for generating a decoded address signal employable for an access into a given memory, comprising:

an address generator for generating a coded address signal consisting of a combination of low swing complementary signals; and an address decoder for decoding the combination of low swing complementary signals in a concurrently amplifying manner to obtain the decoded address signal consisting of a combination of full swing signals.

2. An address generating and decoding device for generating a decoded address signal employable for an access into a given memory, comprising:

an address generator for generating a coded address signal consisting of a combination of low swing complementary signals; and an address decoder for decoding the combination of low swing complementary signals in a concurrently amplifying manner to obtain the decoded address signal consisting of a combination of full swing signals, wherein the address decoder comprises a binary tree of sense amplifiers.

3. The device as claimed in claim 2, wherein the binary tree has a number of stages which correspond one-to-one with the complementary signals;

each stage of the binary tree consists of a corresponding number of sense amplifiers each receiving an enable signal and a corresponding complimentary signal to generate a logical product of the enable signal and the corresponding complementary signal; and a bottom stage of the binary tree consists of the corresponding number of sense amplifiers each outputting the logical product which is to be collected to provide the full swing signals.

4. The device as claimed in claim 3, wherein the complementary signals are each defined by a low swing amplitude with respect to a potential difference between a power supply terminal and a ground terminal of the address decoder; and each sense amplifier outputs the logical product in the form of a pair of logical levels each defined by a full swing amplitude with respect to the potential difference so that the low swing amplitude is amplified to the full swing amplitude.

5. The device as claimed in claim 4, wherein a top stage of the binary tree consists of a sense amplifier receiving the enable signal from outside the address decoder; and an arbitrary stage, except the top stage, of the binary tree consists of the corresponding number of sense amplifiers grouped into pairs each receiving as the enable signal either of the pair of logical levels.

6. An address generating and decoding method for generating a decoded address signal employable for an access into a given memory, comprising the steps of:

generating a coded address signal consisting of a combination of low swing complementary signals; and decoding the combination of low swing complementary signals in a concurrently amplifying manner to obtain the decoded address signal consisting of a combination of full swing signals.

7. The method as claimed in claim 6, wherein the decoding step comprises a logical step of descending through a binary tree of sense amplifiers to obtain the combination of full swing signals in an address decoder.

8. The method as claimed in claim 7, wherein the logical step comprises the steps of:

a preliminary step of having a number of stages of the binary tree, the stages having one-to-one correspondence with the complementary signals;

a sequence of signal processing steps each for inputting, to each sense amplifier in a current stage of the binary tree, an enable signal and a corresponding complementary signal to the current stage to thereby generate a logical product of the enable signal and the corresponding complementary signal; and the sequence of signal processing steps further including a final step of outputting the logical product from each sense amplifier in a bottom stage of the binary tree and collecting the same to thereby provide the full swing signals.

9. The method as claimed in claim 8, wherein the preliminary step further includes having the complementary signals each defined by a low swing amplitude with respect to a potential difference between a power supply terminal and a ground terminal of the address decoder; and each of the signal processing steps further includes outputting from each sense amplifier in the current stage the logical product in the form of a pair of logical levels each defined by a full swing amplitude with respect to the potential difference so that the low swing amplitude is amplified to the full swing amplitude.

10. The method as claimed in claim 9, wherein the preliminary step further includes having the corresponding number of sense amplifiers grouped into pairs in each stage except a top stage of the binary tree; and the sequence of signal processing steps further includes
inputting the enable signal to a sense amplifier in the top stage of the binary tree from outside the address decoder; and inputting the pair of logical levels as the enable signal to each pair of sense amplifiers in the current stage of the binary tree.

11. An address decoding device comprising:

a plurality of input terminals for inputting therethrough a coded address signal consisting of a combination of low swing complementary signals;

an address decoder for decoding the coded address signal in a concurrently amplifying manner to obtain a decoded address signal consisting of a combination of full swing signals; and a plurality of output terminals for outputting therethrough the decoded address signal as an address signal employable for an access into a given memory.

* * * * *